(12) United States Patent
Liao

(10) Patent No.: US 9,368,494 B2
(45) Date of Patent: Jun. 14, 2016

(54) SEMICONDUCTOR DEVICE AND METHOD OF MANUFACTURING THE SAME

(71) Applicant: NANYA TECHNOLOGY CORP., Tao-Yuan Hsien (TW)

(72) Inventor: Wei-Ming Liao, Taoyuan County (TW)

(73) Assignee: NANYA TECHNOLOGY CORP., Gueishan Dist., Taoyuan (TW)

( * ) Notice: Subject to any disclaimer, the term of this patent is extended or adjusted under 35 U.S.C. 154(b) by 0 days.

(21) Appl. No.: 14/537,919

(22) Filed: Nov. 11, 2014

(65) Prior Publication Data

US 2016/0133624 A1     May 12, 2016

(51) Int. Cl.
| | |
|---|---|
| H01L 21/8234 | (2006.01) |
| H01L 27/088 | (2006.01) |
| H01L 27/108 | (2006.01) |
| H01L 27/115 | (2006.01) |

(52) U.S. Cl.
CPC .... *H01L 27/0886* (2013.01); *H01L 21/823431* (2013.01); *H01L 21/823437* (2013.01); *H01L 21/823462* (2013.01); *H01L 21/823475* (2013.01); *H01L 21/823481* (2013.01); *H01L 27/10823* (2013.01); *H01L 27/10826* (2013.01); *H01L 27/11521* (2013.01)

(58) Field of Classification Search
CPC .................... H01L 27/0886; H01L 27/11521; H01L 21/823475–21/823481
USPC .......................................................... 257/334
See application file for complete search history.

(56) References Cited

U.S. PATENT DOCUMENTS

| | | | |
|---|---|---|---|
| 2006/0163667 A1 | 7/2006 | Chung | |
| 2007/0231997 A1* | 10/2007 | Doyle | H01L 29/7853 438/253 |
| 2009/0294837 A1* | 12/2009 | Lee | H01L 27/11521 257/324 |
| 2012/0199888 A1* | 8/2012 | Dai | H01L 29/045 257/288 |
| 2012/0299081 A1 | 11/2012 | Lee | |
| 2015/0069465 A1* | 3/2015 | Cheng | H01L 29/36 257/190 |

* cited by examiner

Primary Examiner — Christine Enad
(74) Attorney, Agent, or Firm — Winston Hsu; Scott Margo

(57) ABSTRACT

A semiconductor device with neck fins comprises a substrate, a plurality of fins having a lower portion and a neck upper portion on the substrate, and insulators disposed between each fin and flush with the lower portion of the fins.

4 Claims, 6 Drawing Sheets

SEMICONDUCTOR DEVICE AND METHOD OF MANUFACTURING THE SAME

BACKGROUND OF THE INVENTION

1. Field of the Invention

The present disclosure relates to a semiconductor device and a method of manufacturing the same, and more specifically, to a recessed channel array transistor (RCAT) with neck fins and a method of manufacturing the same.

2. Description of the Prior Art

As semiconductor memory devices become more highly integrated, memory cells gradually become smaller. As such, a variety of efforts have been made to form a memory device having a desired cell capacitance and/or to increase a cell transistor characteristic in smaller memory cells. As the size of the memory cell decreases, a cell transistor having a smaller size may be needed. To implement a cell transistor having desired characteristics in spite of the miniaturization of the memory cell, a method of controlling the concentration of impurities in a diffusion layer has been proposed. As the length of a channel decreases, controlling the depth of the diffusion layer of a transistor becomes increasingly difficult in a variety of thermal treatment processes during a device manufacturing process. As an effective channel length and/or a threshold voltage decrease, a short channel effect occurs. The short channel effect causes problems in the operation of the cell transistor.

To address the above problem, a recessed channel array transistor (RCAT), in which a recess is formed on a surface of a substrate and a gate of a transistor is formed in the recess, is developed. Because the gate is disposed in the recess formed in the substrate, the distance between a source and a drain is extended such that the effective channel length increases, thereby improving the short channel effect.

However, as NAND flash memory is further scaled, parasitic capacitance coupling between the selected wordline and adjacent floating gates (FG) and control gates (CG) in RCAT becomes problematic. Because of the parasitic coupling, the adjacent cells are more prone to $V_{pass}$ disturb than the other cells that also share the common bitline with the cells being programmed. This phenomenon is also referred to as Edge Wordline Disturb (EWD), represented a reliability issue on traditional Flash NAND memories evidenced as an unwanted positive threshold voltage shift of all the cells belonging to the first wordline (WL0) connected to the Ground Select Transistor (GSL).

One conventional approach to solve wordline Disturb is implantation control for forming asymmetric junction (deeper Dgt junction), but this approach would reduce the window of cell side junction control. The other approach is directed to the deeper fin structure, but the process of forming deeper fin is apt to damage the array bottom and change the performance.

For the reasons stated above, and for other reasons stated below which will become apparent to those skilled in the art upon reading and understanding the present specification, there is a need in the art for a way to minimize the adjacent wordline disturb over the range of $V_{pgm}$ voltages.

SUMMARY OF THE INVENTION

In order to mitigate the adjacent wordline disturb issue, a semiconductor structure with neck saddle fins is provided in the present invention. The neck saddle fins (narrower and concave at both sides) combining with heavier implant modification shows a significant improvement for adjacent wordline disturb issue with smaller $V_t/SV_t$, higher $I_{ds}$, and better $I_{ds}/I_{off}$ at same $S_{Vt}$.

One objective of the present invention is to provide a semiconductor device with neck fins. The semiconductor device includes a substrate, a plurality of fins having a lower portion and a neck upper portion on the substrate, and insulators disposed between each fin and flush with the lower portion of the fins.

Another objective of the present invention is to provide a method for manufacturing a semiconductor device with neck fins. The method includes the steps of forming a plurality of fins on a substrate, forming insulators flush with and between each fin, forming photoresists only on the top surface of the fins, removing a portion of the insulators to make the upper portion of the fins protrude from the insulators, and etching the protruding upper portion of the fins with the photoresists disposed on the fins to form a neck upper portion of the fins.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

Figure 1:
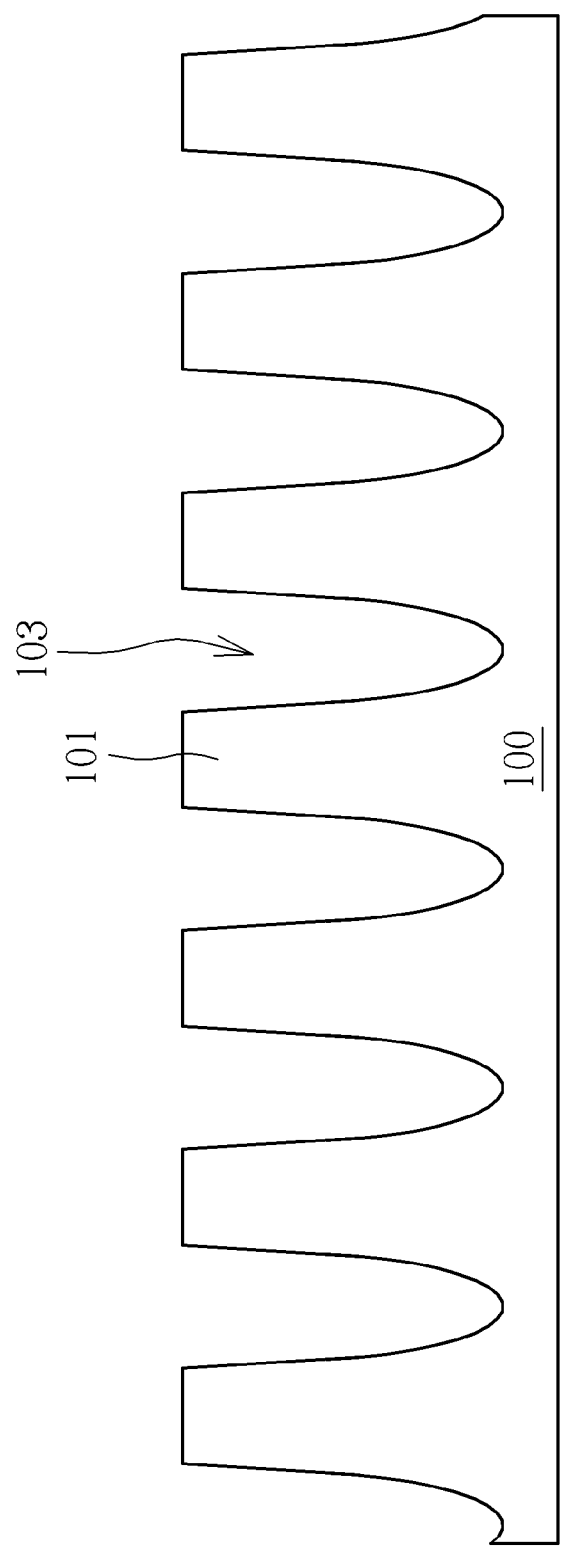
FIGS. 1-6 are cross-sectional views schematically depicting an exemplary process flow of forming a semiconductor device with neck fins in accordance with the embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the present invention, reference is made to the accompanying drawings which form a part hereof and is shown by way of illustration and specific embodiments in which the invention may be practiced. These embodiments are described in sufficient details to enable those skilled in the art to practice the invention. Other embodiments may be utilized and structural, logical, and electrical changes may be made without departing from the scope of the present invention. The following detailed description, therefore, is not to be taken in a limiting sense, and the scope of the present invention is defined by the appended claims.

Before describing the preferred embodiment in more detail, further explanation shall be given regarding certain terms that may be used throughout the descriptions.

The term "etch" or "etching" is used herein to generally describe a fabrication process of patterning a material, such that at least a portion of the material remains after the etch is completed. For example, it should be understood that the process of etching silicon involves the steps of patterning a masking layer (e.g., photoresist or a hard mask) above the silicon, and then removing the areas of silicon no longer protected by the masking layer. As such, the areas of silicon protected by the mask would remain behind after the etch process is complete. However, in another example, etching may also refer to a process that does not use a mask, but still leaves behind at least a portion of the material after the etch process is complete. The above description serves to distinguish the term "etching" from "removing." When etching a material, at least a portion of the material remains behind after the process is completed. In contrast, when removing a material, substantially all of the material is removed in the process. However, in some embodiments, "removing" is considered to be a broad term that may incorporate etching.

During the descriptions herein, various regions of the substrate upon which the field-effect devices are fabricated are mentioned. It should be understood that these regions may exist anywhere on the substrate and furthermore that the regions may not be mutually exclusive. That is, in some embodiments, portions of one or more regions may overlap. Although up to three different regions are described herein, it should be understood that any number of regions may exist on the substrate and may designate areas having certain types of devices or materials. In general, the regions are used to conveniently describe areas of the substrate that include similar devices and should not limit the scope or spirit of the described embodiments.

The terms "forming," "form," "deposit," or "dispose" are used herein to describe the act of applying a layer of material to the substrate. Such terms are meant to describe any possible layer-forming technique including, but not limited to, thermal growth, sputtering, evaporation, chemical vapor deposition, epitaxial growth, electroplating, etc. According to various embodiments, for instance, deposition may be performed according to any appropriate well-known method. For instance, deposition can comprise any process that grows, coats, or transfers material onto a substrate. Some well-known technologies include physical vapor deposition (PVD), chemical vapor deposition (CVD), electrochemical deposition (ECD), molecular beam epitaxy (MBE), atomic layer deposition (ALD), and plasma-enhanced CVD (PECVD), amongst others.

The "substrate" as used throughout the descriptions is most commonly thought to be silicon. However, the substrate may also be any of a wide array of semiconductor materials such as germanium, gallium arsenide, indium phosphide, etc. In other embodiments, the substrate may be electrically non-conductive such as a glass or sapphire wafer.

In the exemplary embodiment of the present invention, the semiconductor device functions as a part of dynamic random access memory (DRAM). The semiconductor device includes a semiconductor substrate 1 having a cell array region with multiple memory cells (not shown) arranged in a matrix. Since the present invention concentrates primarily on the novel neck profile of fin structures, detailed process explanation will be directed in reference to the cross-sectional views instead of plan views, and the size, the thickness, and the like of each illustrated portion might be different from those of each portion of an actual semiconductor device.

Please refer to FIG. 1. A substrate 100 is first provided to serve as a base for forming the fin structure. The substrate 100 may include, but is not limited to, a silicon substrate, a silicon-containing substrate, a GaN-on-silicon (or other material of Group III-V), a grapheme-on-silicon substrate or a silicon-on-insulator (SOI) substrate, and so on.

A plurality of fins 101, for example the saddle fins for connecting wordlines, are formed on the substrate 100. The fins 101 may be formed by the following process: (1) forming a mask layer (not shown) over the substrate 100. The mask layer may include a silicon nitride (SiN) film, an amorphous carbon (α-C) film, a silicon oxynitride (SiON) film, a silicon oxide (SiO) film, or an anti-reflective (BARC) film; (2) forming a photoresist (PR) film over the mask layer. The photoresist film is patterned by a lithography process corresponding to the shape of the active region; (3) patterning the mask layer by an anisotropic dry etching process with the resist pattern as a mask, then the shape of the resist pattern is transferred onto the mask layer; (4) patterning the semiconductor substrate 100 by an anisotropic dry etching process with the patterned mask layer. The shape of the mask layer is transferred onto the surface of the semiconductor substrate 100, and multiple fins 101 are formed extending from the substrate 100 with isolation trenches 103 formed therebetween; and (5) removing the patterned hard mask layer by a wet-etching process with heated phosphorous acid ($H_3PO_4$). Since the above process for forming regular fin structures is conventional and well-known by those skilled in the art, further detailed description and relevant illustrations are omitted in the specification for simplification.

Figure 2:
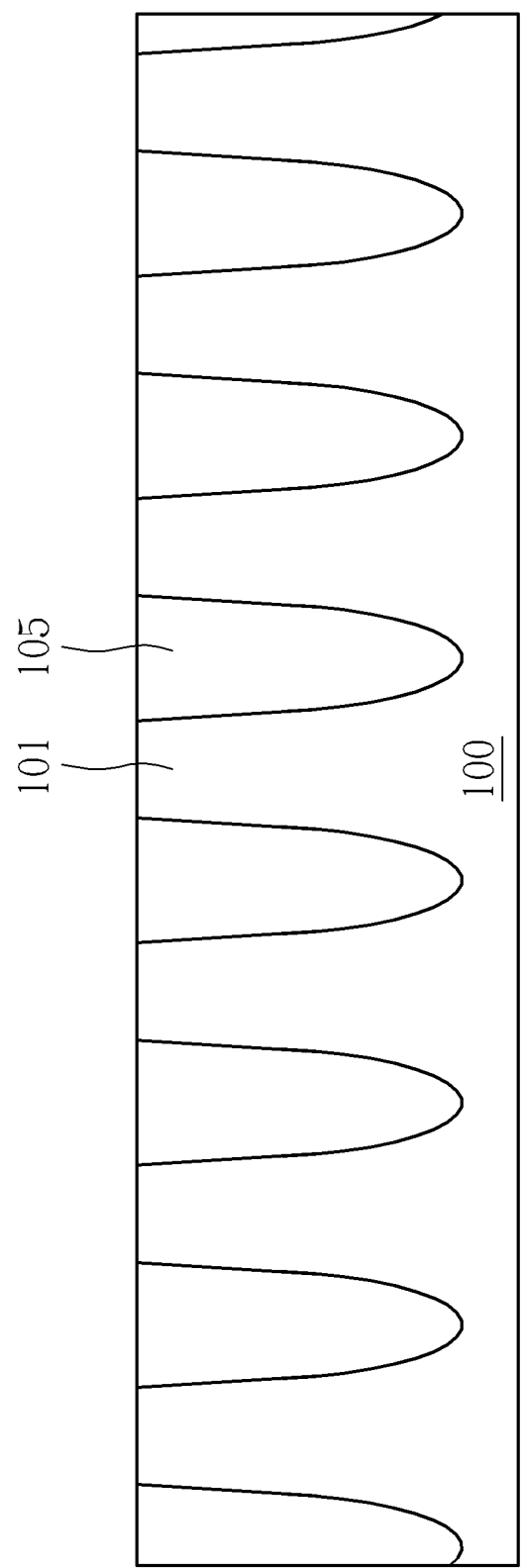

Please refer now to FIG. 2. After forming fins 101 and defining the isolation regions and the active regions, insulators 105 flush with the fins 101 are formed between each fins 101. In the embodiment, the insulators 105 may be formed by first depositing a silicon oxide film, silicon nitride film (not shown) or both of them by an HDP-CVD (High Density Plasma Chemical Vapor Deposition) process or LP-CVD (Low Pressure-Chemical Vapor Deposition) process over the entire surface of the semiconductor substrate 100. The silicon oxide film or silicon nitride film fills up the isolation trenches 103 between the fins 101 and cover the fins 101. Then, the surface of silicon oxide (nitride) film is polished by a CMP (Chemical Mechanical Polishing) process until the top surfaces of the fins 101 are exposed. In an embodiment, the insulator 105 may be a shallow trench isolation (STI). The fins 101 and the insulators 105 define the isolation regions and the active regions of the device, which may be alternately arranged in parallel and extend in the first direction.

Figure 3:
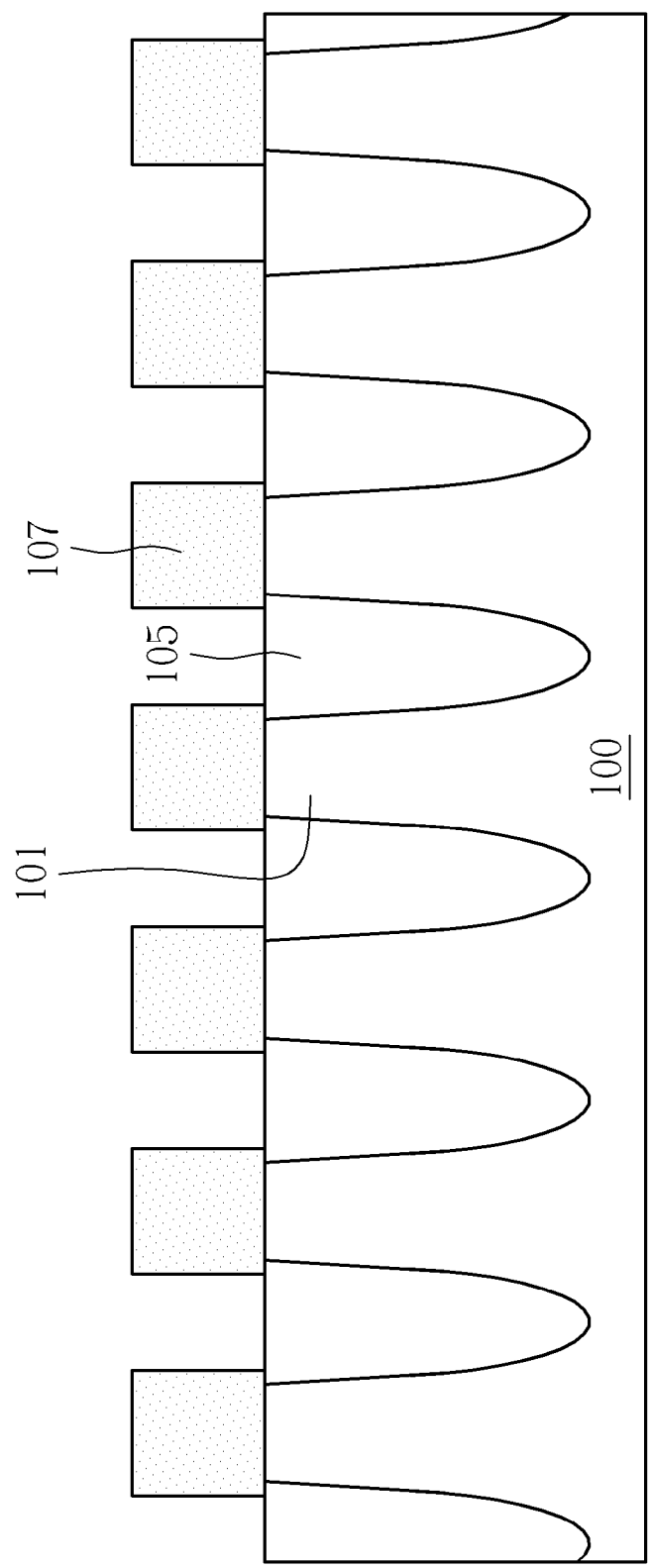

Please refer now to FIG. 3. After forming the insulators 105 and obtaining a flat surface on the substrate 100, a patterned photoresist 107 is formed on the substrate 100. As shown in FIG. 3, the patterned photoresist 107 is configured to cover exactly on the exposed fins 101. In the embodiment of the present invention, the patterned photoresist 107 may be similar to the photoresist used to pattern the hard mask and define the fins 101 (i.e. active area) in the step shown in FIG. 1. It should be noted that the width of patterned photoresist 107 should be at least larger than the width of fin 101 in order to cover entire fins 101. As shown in FIG. 3, only the insulators 105 are exposed after the patterned photoresist 107 is formed.

Figure 4:
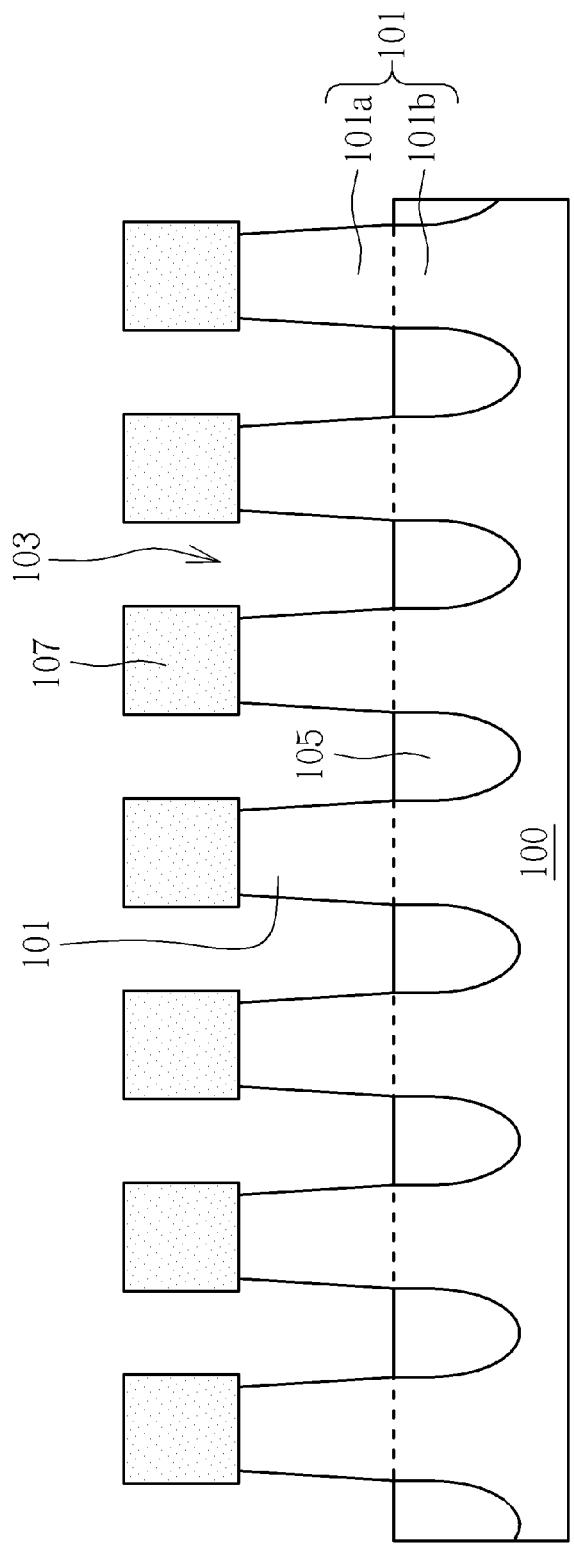

Please refer now to FIG. 4. After covering the pattern photoresist 107 on the fins 101, an etch-back process is performed to remove a portion of the insulators 105. The etch-back process reduces the thickness of the insulator 105 and makes a portion of the fin protrude from the reduced insulators 105. In the case that the insulator 105 is silicon oxide film, the insulator 105 may be selectively removed (reduced) by an anisotropic etching process or a wet-etching process with hydrofluoric acid (HF). Alternatively, in the case that the insulator 105 is silicon nitride film, the insulator 105 may be selectively removed (reduced) by a wet-etching process with a heated phosphoric acid ($H_3PO_4$). At this time, the insulator 105 with a predetermined vertical thickness remains in the bottom of the trench 103 in the cell array region. In the embodiment, the protruding portion of the fin 101 is referred to as the upper portion 101a of the fin 101, and the unexposed portion of the fin 101 is referred to as the lower portion 101b of the fin 101. Please note that the remaining insulator 105 is flush with the lower portion 101b of the fin 101.

Figure 5:
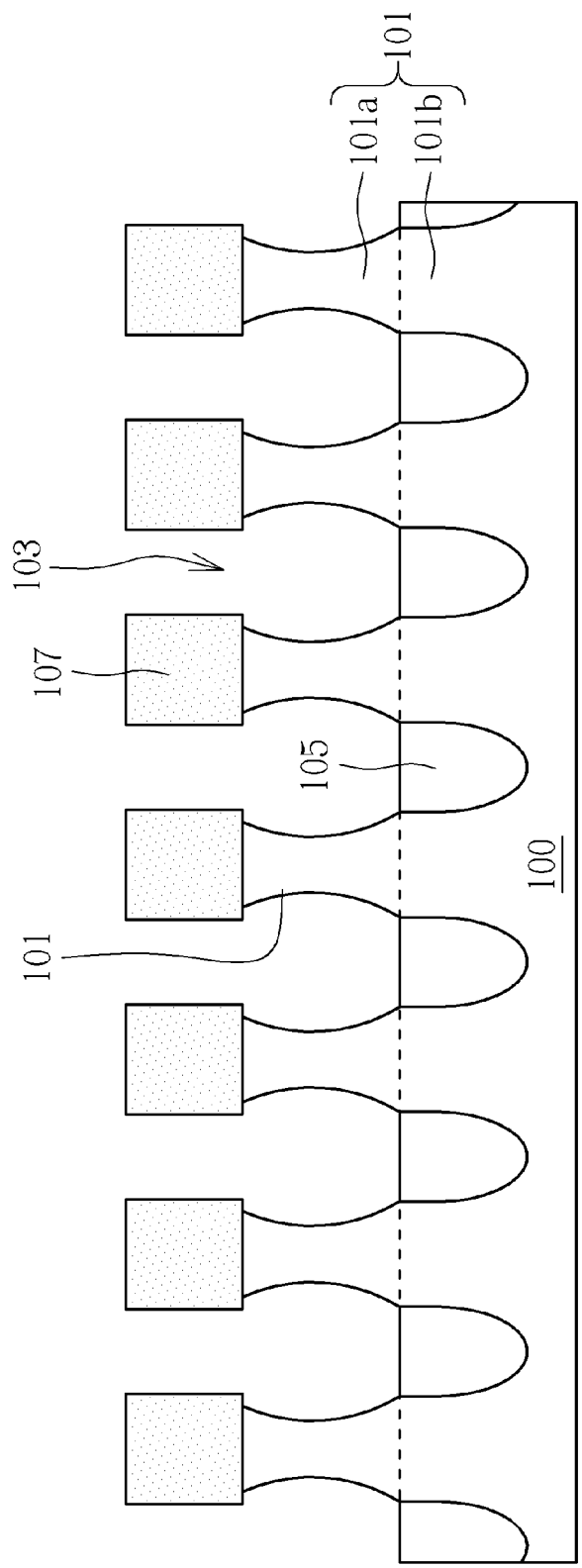

Please refer now to FIG. 5. After reducing the thickness of the insulator 105 and forming a protruding upper portion 101a of the fin 101, a dry etch process is performed to etch the exposed upper portion 101a of the fin 101. Unlike a common dry etch process, this dry etch process is performed with the patterned photoresist 107 covering on the fin 101. The etching reaction starts from the sidewalls of fins 101 without etching the top surface. Moreover, in this embodiment, the middle of exposed sidewall of the fin 101 would be subject to more etching reaction than the corner of the sidewall. Thus it can be noted that the decrease in the width of the middle portion of the fin 101 would be more than the corner portions, thereby forming a protruding neck upper portion 101a of the fins 101. The above lateral etching process also provides the efficacy to reduce the width of the fins 101.

Figure 6:
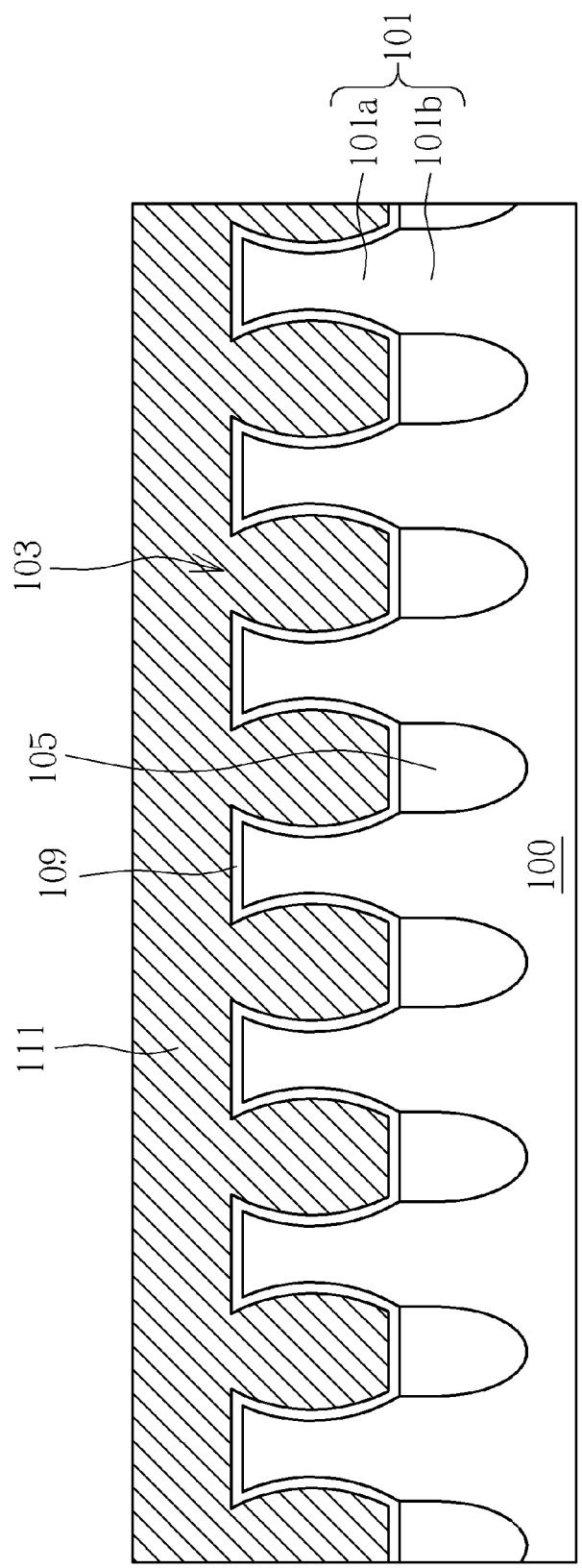

After forming the protruding neck fins 101, please refer to FIG. 6, the following process may be standard RCAT process, for example: (1) removing the patterned photoresist 107 by a strip process; (2) forming a conformal gate insulating film 109 on the fins 101 and the substrate 100 by a thermally-oxidized process such as an ISSG (In Situ Stream Generation) process; and (3) forming a conductive layer 111 on the fins 101 and the substrate 100. Please note that the conductive layer 111 in the embodiment is formed with part of the conductive layer 111 buried in the recessed gate trenches 103 and straddling across the fins 101, thereby forming a saddle-fin channel structure. The channel structure of the semiconductor device can achieve a longer gate length and prevent the short channel effect. In the embodiment, the conductive layer 111 may serve as a gate electrode (i.e., word line) of the selection transistor in DRAM structure. The conductive layer 111 may be further connected with the contact pads disposed in the peripheral region.

Other regular RCAT processes, for example the process to form drain regions, source regions, or dummy word lines, are omitted in the embodiment for simplification and so as not to obscure the spirit and scope of the present invention. It is apparent that the present invention is not limited to the above embodiments, and may be modified and changed without departing from the scope and spirit of the invention. For example, the present invention is not limited to the semiconductor device having the saddle-fin-shaped channel structure, and is applicable to various semiconductor devices having three-dimensional channel structures, such as a recessed channel structure and a fin-shaped channel structure. In addition, while not specifically claimed in the claim section, the application reserves the right to include in the claim section at any appropriate time the following semiconductor device.

The above process provided by the present invention can manufacture a semiconductor device with neck saddle fins. This neck, concave sidewall profile not only mitigates the conventional adjacent wordline disturb issue, but also provides a narrower width for the fin structure formed by normal RCAT process. Combining with heavier implant modification, the neck saddle fins can further show a significant improvement in the electrical performance, such as smaller $V_t/SV_t$, higher $I_{ds}$, and better $I_{ds}/I_{off}$ at same $S_{Vt}$.

On the basis of above-described process, the present invention also provides a semiconductor device including, but is not limited to, a substrate 100, a plurality of fins 101 on the substrate 100, wherein each fin 101 has a lower portion 101b and a neck upper portion 101a, and insulators 105 disposed between each fin 101 and flush with the lower portion 101b of fins 101.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for manufacturing a semiconductor device, comprising:

forming a plurality of fins on a substrate by using a first photoresist pattern;

removing the first photoresist pattern;

after removing the first photoresist pattern, forming insulators between said fins, wherein said insulators are flush with said fins;

after forming the insulators, forming a second photoresist pattern on the top surfaces of said fins, wherein a width of the second photoresist pattern is larger than a width of the fin;

removing a portion of said insulators to make an upper portion of said fins protrude from said insulators; and etching entire sidewalls of said protruding upper portion of said fins with said second photoresist pattern disposed on said fins to form a neck upper portion of said fins.

2. The method for manufacturing a semiconductor device of claim 1, further comprises removing said second photoresist pattern after forming said neck upper portion of said fins.

3. The method for manufacturing a semiconductor device of claim 1, further comprises forming a conformal gate insulating layer on said neck upper portion of said fins and said insulators.

4. The method for manufacturing a semiconductor device of claim 3, further comprises forming a word line saddling across said neck upper portion of said fins.

* * * * *